United States Patent
Abe

(10) Patent No.: US 8,059,462 B2
(45) Date of Patent: Nov. 15, 2011

(54) NONVOLATILE SEMICONDUCTOR MEMORY DEVICE

(75) Inventor: Takumi Abe, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 248 days.

(21) Appl. No.: 12/434,799

(22) Filed: May 4, 2009

(65) Prior Publication Data

US 2009/0290416 A1    Nov. 26, 2009

(30) Foreign Application Priority Data

May 22, 2008 (JP) .............................. 2008-134093

(51) Int. Cl.
*G11C 11/34* (2006.01)
*G11C 16/04* (2006.01)
*G11C 5/06* (2006.01)

(52) U.S. Cl. ......... 365/185.17; 365/185.05; 365/185.27; 365/63

(58) Field of Classification Search ........... 8/63, 185.05, 8/185.17, 185.27
See application file for complete search history.

(56) References Cited

U.S. PATENT DOCUMENTS

| | | | |
|---|---|---|---|
| 5,591,999 A * | 1/1997 | Momodomi et al. | 257/315 |
| 7,221,017 B2 * | 5/2007 | Forbes et al. | 257/316 |
| 7,286,403 B2 | 10/2007 | Maejima | |
| 2006/0002216 A1 * | 1/2006 | Ooishi | 365/210 |
| 2006/0198196 A1 | 9/2006 | Abe et al. | |
| 2008/0031048 A1 * | 2/2008 | Jeong et al. | 365/185.17 |
| 2008/0186766 A1 * | 8/2008 | Ogura et al. | 365/185.05 |
| 2009/0027941 A1 * | 1/2009 | Maejima et al. | 365/63 |

FOREIGN PATENT DOCUMENTS

| | | |
|---|---|---|
| JP | 2006-245547 | 9/2006 |
| JP | 2006-302960 | 11/2006 |

* cited by examiner

*Primary Examiner* — Ly D Pham
(74) *Attorney, Agent, or Firm* — Oblon, Spivak, McClelland, Maier & Neustadt, L.L.P.

(57) ABSTRACT

The nonvolatile semiconductor memory device related to an embodiment of the present invention includes a cell array including a memory string, a bit line connected to the memory string, a first wire connected to a cell source line of a memory cell, a second wire connected to a cell well line of a memory cell, a third wire which supplies a power supply voltage to a circuit arranged outside of a region of the cell array, a fourth wire and a fifth wire being arranged in a row direction within the cell array region, and the first wire, the second wire and the third being formed in a layer above a layer in which the bit line within the cell array is formed, the fourth wire and the fifth wire being formed in the layer in which the bit line within the cell array region is formed.

17 Claims, 9 Drawing Sheets

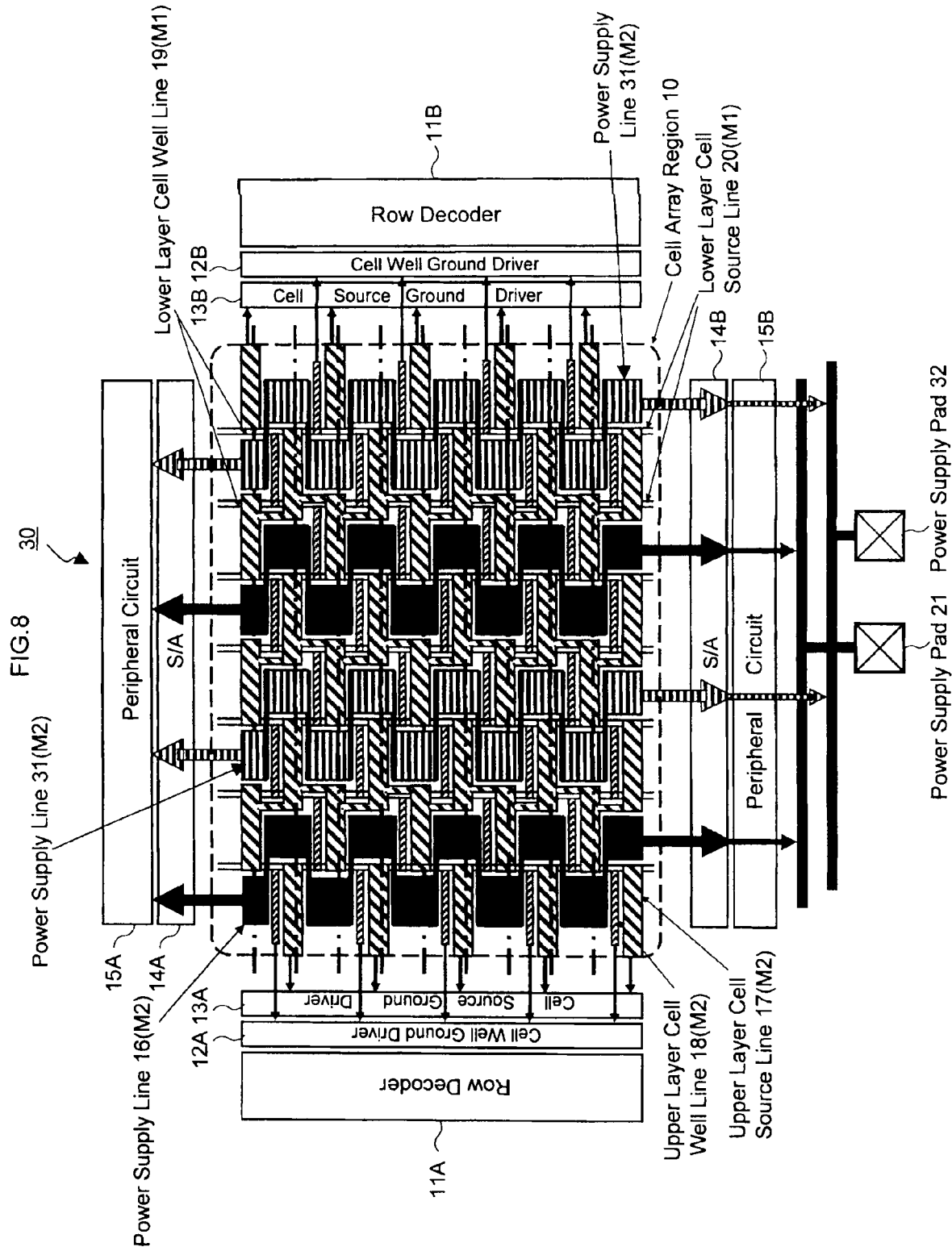

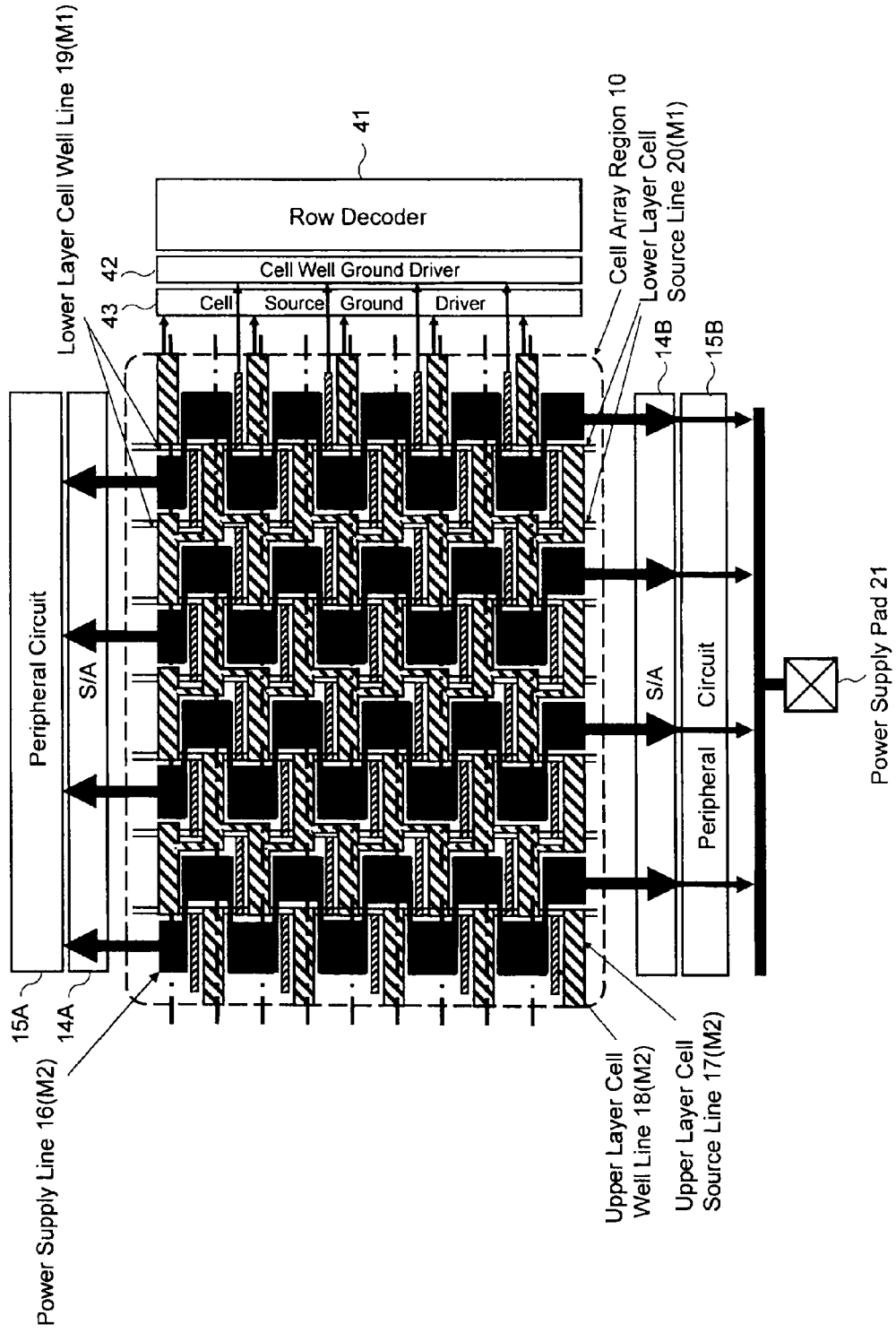

NONVOLATILE SEMICONDUCTOR MEMORY DEVICE

CROSS REFERENCE TO RELATED APPLICATION

This application is based upon and claims the benefit of priority from the prior Japanese Patent Application No. 2008-134093, filed on May 22, 2008, the entire contents of which are incorporated herein by reference.

BACKGROUND OF THE INVENTION

1. Field of the Invention

The present invention relates to a nonvolatile semiconductor memory device and in particular, a nonvolatile semiconductor memory device arranged with a plurality of nonvolatile semiconductor memory devices.

2. Description of the Related Art

There is a tendency to adopt methods for increasing the number of memory cells which are read once with the aim of improving the capabilities in addition to large capacity in a NAND type flash memory. Consequently, improvements in drive ability of a cell source line into which a large current flows or a ground driver of a cell well line for suppressing noise are being desired. In answer to such demands, methods are being proposed such as the method disclosed in the nonvolatile semiconductor memory device in the Japanese Laid Open Patent 2006-302960, for example, in which the ground capability of a ground driver is maximized by arranging a high voltage transistor region between a sense amplifier region and a memory cell array.

In addition, in the Japanese Laid Open Patent 2006-302960, a cell source line, cell well line and power supply line are connected to the source/drain of a high voltage transistor which comprises a ground driver. However, in an actual chip, the wiring layer immediately above a ground driver are covered by a wire which connects a bit line and a sense amplifier region, the wire pitch becomes more narrow with the progress of high integration and it becomes more difficult to pass the wires themselves through. Consequently, even if the width of a wire becomes smaller due to miniaturization, it becomes more difficult to pass a cell source line, cell well line and power supply line through a wiring layer.

Also, in the nonvolatile semiconductor memory device in Japanese Laid Open Patent 2006-245547, a method is proposed for maximizing the grounding ability of a ground driver by lowering the resistance of a cell source line, cell well line and power supply line which are arranged above a cell array. Furthermore, there is a tendency for a consumption current to increase with large capacity memory and high functionality and while further strengthening of a power supply line is becoming essential, in order to achieve this an increase in the width of power supply line is required which leads to an increase in the size of a chip.

BRIEF SUMMARY OF THE INVENTION

The nonvolatile semiconductor memory device related to an embodiment of the present invention includes a cell array including a memory string arranged in a matrix shape, the memory string including a plurality of memory cells connected in series, a bit line connected to the memory string, a first wire connected to a cell source line of a memory cell of the plurality of memory cells, a second wire connected to a cell well line of a memory cell of the plurality of memory cells, a third wire which supplies a power supply voltage to a circuit arranged outside of a region of the cell array, a fourth wire arranged in a row direction within the cell array region, a fifth wire arranged in a row direction within the cell array region, and the first wire, the second wire and the third wire being formed in a layer above a layer in which the bit line within the cell array region is formed, the fourth wire and the fifth wire being formed in the layer in which the bit line within the cell array region is formed, and the first wire and the fourth wire being connected and the second wire and the fifth wire being connected.

BRIEF DESCRIPTION OF THE DRAWINGS

FIG. 8 is a planar view diagram which shows the structure of a NAND type flash memory related to the second embodiment of the present invention.

FIG. 9 is a planar view diagram which shows the structure of a NAND type flash memory related to the third embodiment of the present invention.

DETAILED DESCRIPTION OF THE INVENTION

The embodiments of the present invention will be explained below while referring to the diagrams. The nonvolatile semiconductor memory device related to the embodiments will be explained using a NAND type flash memory as an example. Furthermore, because the same structural elements in the embodiments have the same symbols, a number of explanations will be omitted to avoid repetition.

First Embodiment

Figure 1:
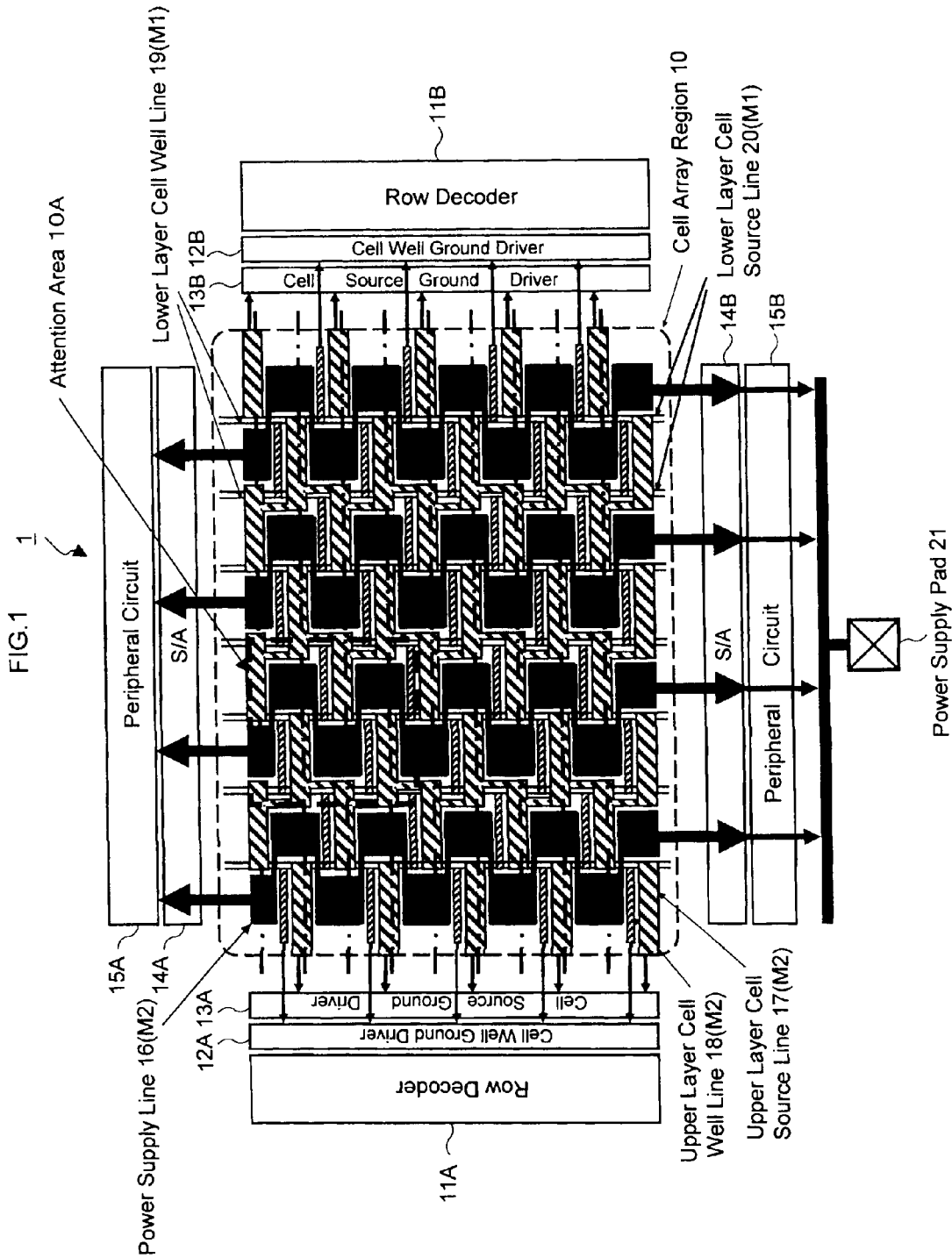
FIG. 1 is a planar view diagram which shows the structure of a NAND type flash memory related to the first embodiment of the present invention.

FIG. 1 is a planar view diagram which shows the structure of a NAND type flash memory related to the first embodiment of the present invention. In FIG. 1, a NAND type flash memory 1 is arranged with a cell array region 10 in which a plurality of memory strings (not shown in the diagram) are formed in a matrix shape, a row decoder 11A and a row decoder 11B arranged at either end in a word line direction (horizontal direction in the diagram) outside of the cell array region 10, cell source ground drivers 12A and 12B and cell well ground drivers 13A and 13B arranged between the cell array region 10 and the row decoder 11A, 11B, sense amplifier circuits (S/A) 14A, 14B and peripheral circuits 15A, 15B arranged at either end in a bit line direction outside of the cell array region 10. Furthermore, each memory string is comprised of a plurality of memory cells (not shown in the diagram) connected in series.

As is shown in FIG. 1, a plurality of power supply lines (third wires) 16 are formed in a bit line direction within the cell array region 10. FIG. 1 shows the case where four power supply lines 16 are formed. Each power supply line 16 is formed without division in a bit line direction (vertical direction in the diagram) on a layer M2 (uppermost layer) within the cell array region 10. The ends of each power supply line 16 are respectively connected to the sense amplifier circuits (SA) 14A, 14B and the peripheral circuits 15A, 15B, and the power supply lines 16 are wires which supply a power supply voltage (Vdd, Vss etc) to each circuit. Furthermore, at the bottom end of FIG. 1, a power supply pad 21 for connecting a power supply etc is arrange on the exterior of the memory chip. The power supply pad 21 is connected to a plurality of power supply lines 16.

In addition, a plurality of upper layer cell source lines 17 and a plurality of upper layer cell well lines 18 are formed in a bit line direction within the cell array region 10. The upper layer cell source lines 17 and upper layer cell well lines 18 are formed on a layer M2 (lowermost layer) within the cell array region 10. Furthermore, a region in which there no memory cells are arranged within the cell array region 10 is referred to below as a shunt region.

The plurality of upper layer cell source lines (first wires) 17 are mutually connected by a plurality of lower layer cell source lines 20 and also connected to the cell source ground drivers 13A and 13B. The lower layer cell source lines (fourth wires) 20 are formed in the shunt region on a layer M1 below the layer M2 stated above. Furthermore, each upper layer cell source line 17 is connected to a drain terminal of a transistor (not shown in the diagram) within the cell source ground driver 13A and 13B. The upper layer cell source lines 17 are grounded by an operation of a transistor within the cell source ground drivers 13A and 13B.

The plurality of upper layer cell well lines (second wires) 18 are formed on the layer M2 stated above within the cell array region 10, and are mutually connected by the plurality of lower layer cell well lines 19 and also connected to the cell well ground drivers 12A and 12B. The lower layer cell well lines (fifth wires) 19 are formed in the shunt region on a layer M1 below the layer M2 stated above. Furthermore, each upper layer cell well line 18 is connected to a drain terminal of a transistor (not shown in the diagram) within the cell well ground driver 12A and 12B. The upper layer cell well lines 18 are grounded by an operation of transistor within the cell well ground drivers 12A and 12B.

Generally, in a NAND type flash memory, miniaturization and high integration is progressing in order to achieve large capacity and improvements in capability. As a result, a pair of memory strings formed in a matrix shape within a cell array region are packed tightly together and the above stated shunt region becomes even more narrow. That is, in the case where miniaturization and high integration is progressing in order to achieve large capacity and improvements in capability, the density of wires which are connected to sense amplifier circuits and peripheral circuit which are arranged in a bit line direction becomes higher making it more difficult to further increase cell source lines and cell well lines in a bit line direction. Consequently, for example, a ground driver is arranged in a peripheral circuit region further to the exterior of the cell array region and attempts have been made to pass cell source lines and cell well lines to the external ground driver from within the cell array region. However, in the case, the wire distance of a cell source line and a cell well line becomes longer making this undesirable due to the possibility of an increase in wire resistance.

In the chip layout within the type of cell array region shown in FIG. 1, in the case where miniaturization and high integration is progressing in order to achieve large capacity and improvements in capability, the number of wires (bit line BL or power supply line) which are arranged in parallel to a bit line increases and wire density becomes higher. As a result, a ground driver is arranged in a bit line direction outside of a cell array region and it is difficult to pass a cell source line and cell well line in a bit line direction to the same layer as the layer in which a bit line BL is formed within the cell array region.

Thus, in the NAND type flash memory 1 shown in FIG. 1, by arranging the ground drivers 12A, 12B, 13A, 13B on the side of the row decoders 11A, 11B outside the cell array region 10, and by forming the power supply lines (third wires) 16, cell well lines (second wires) 19 and cell source lines (first wires) 20 on a different layer to the layer in which a bit line BL is formed within the cell array region 10, a structure is obtained in which it is possible to lower the resistance value of the cell well lines 19 and the cell source lines 20 and also pass the power supply lines 16 in a bit line direction.

Figure 2:
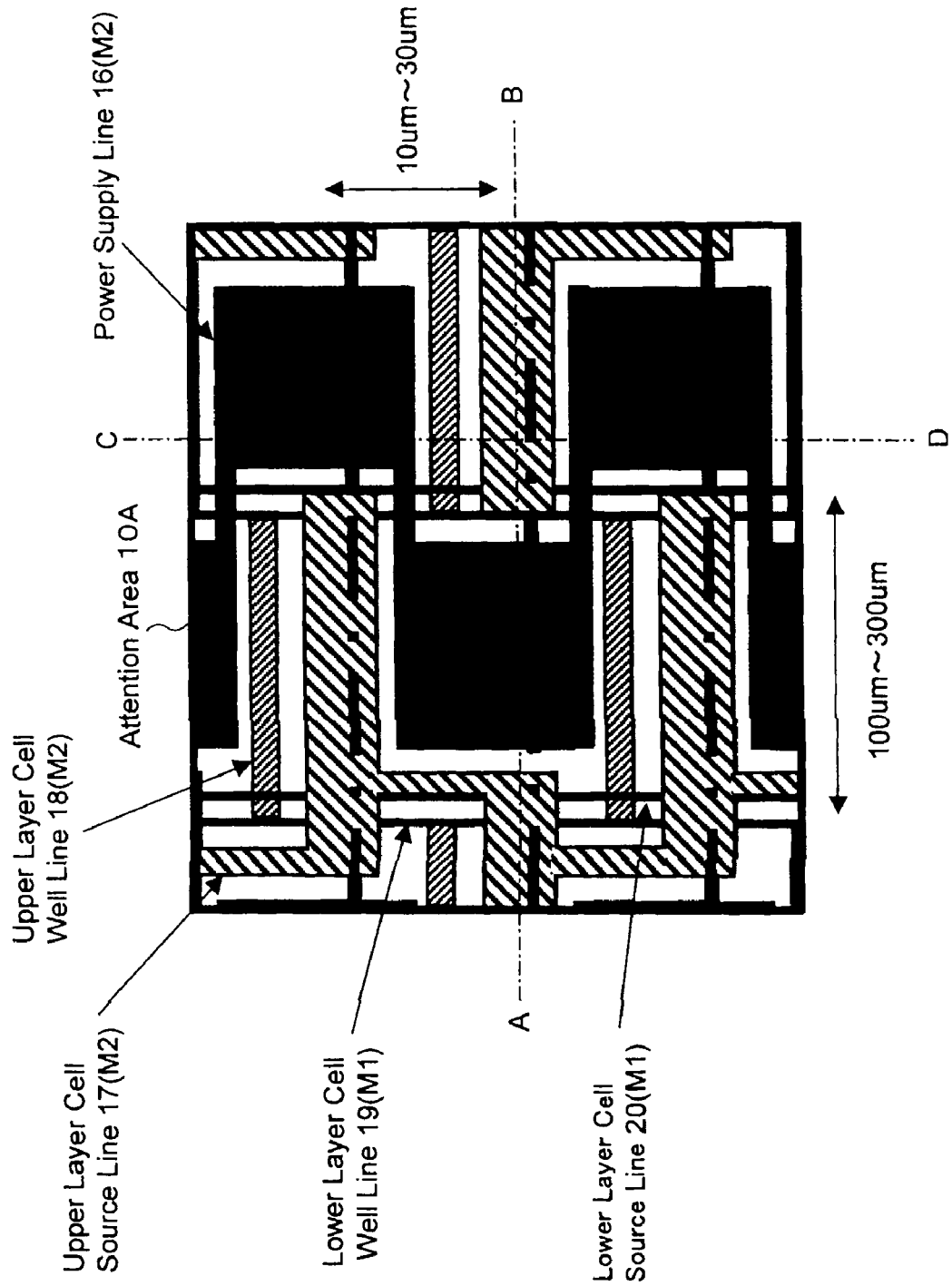
FIG. 2 is an expanded view diagram of the attention area in FIG. 1 related to the first embodiment of the present invention.
Figure 3:
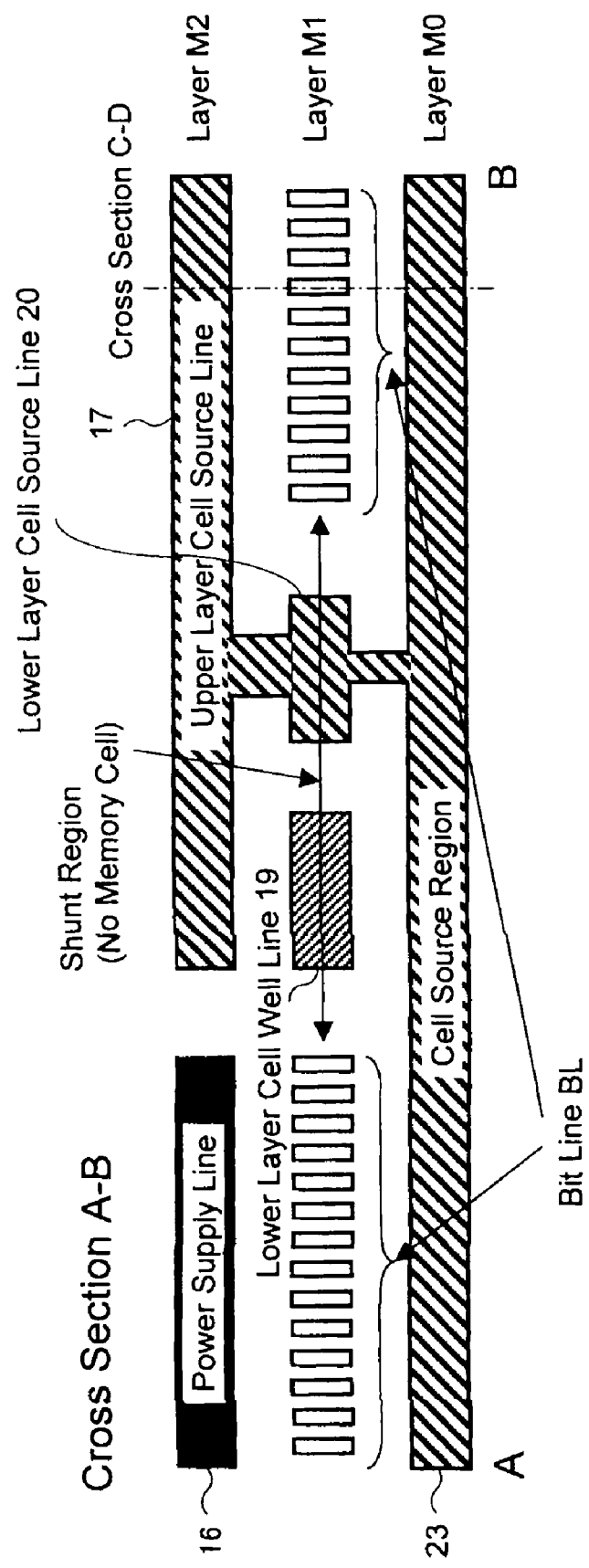
FIG. 3 is a diagram which shows a cross section structure of the line A-B in FIG. 2 related to the first embodiment of the present invention.
Figure 4:
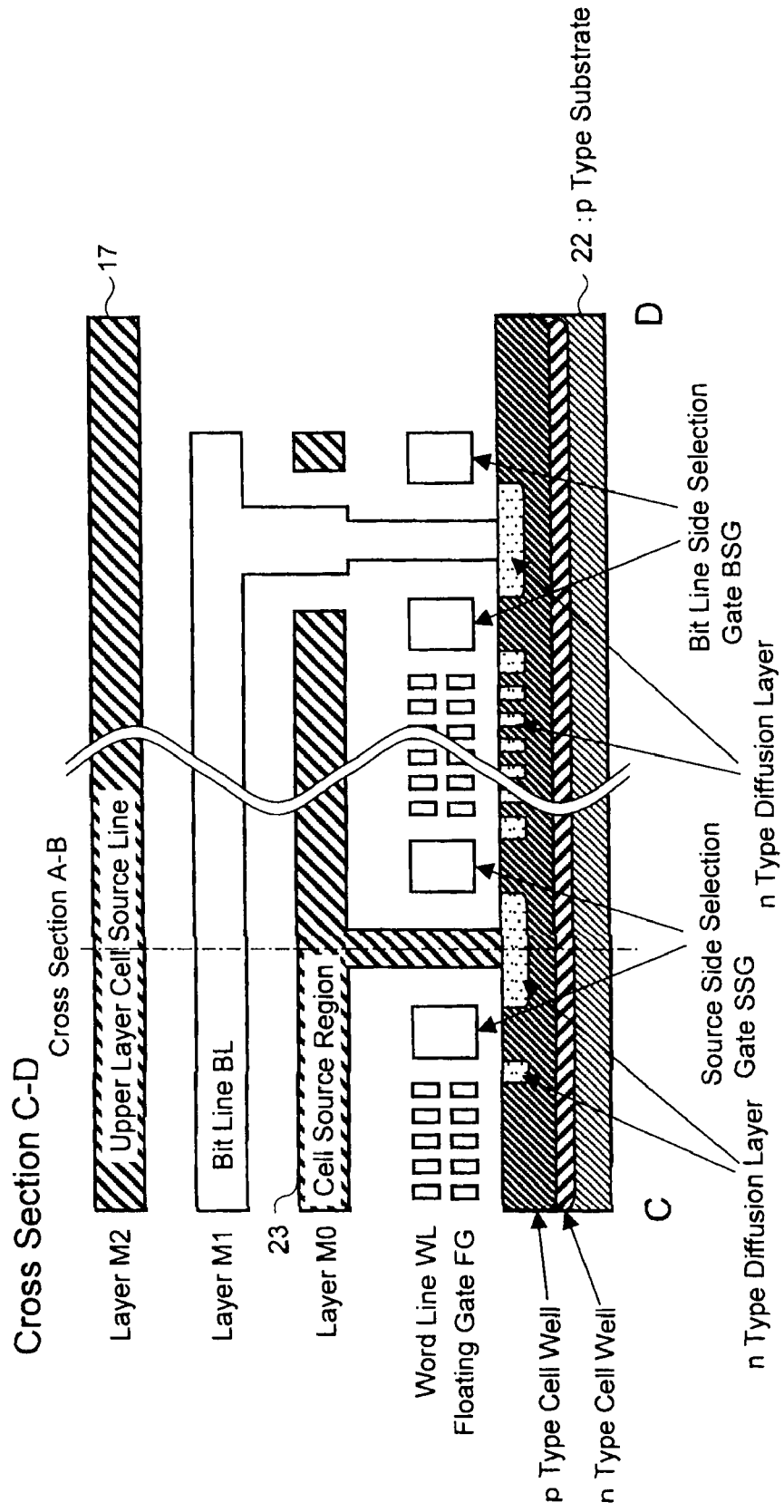
FIG. 4 is a diagram which shows a cross section structure of the line C-D in FIG. 2 related to the first embodiment of the present invention.
Figure 5:
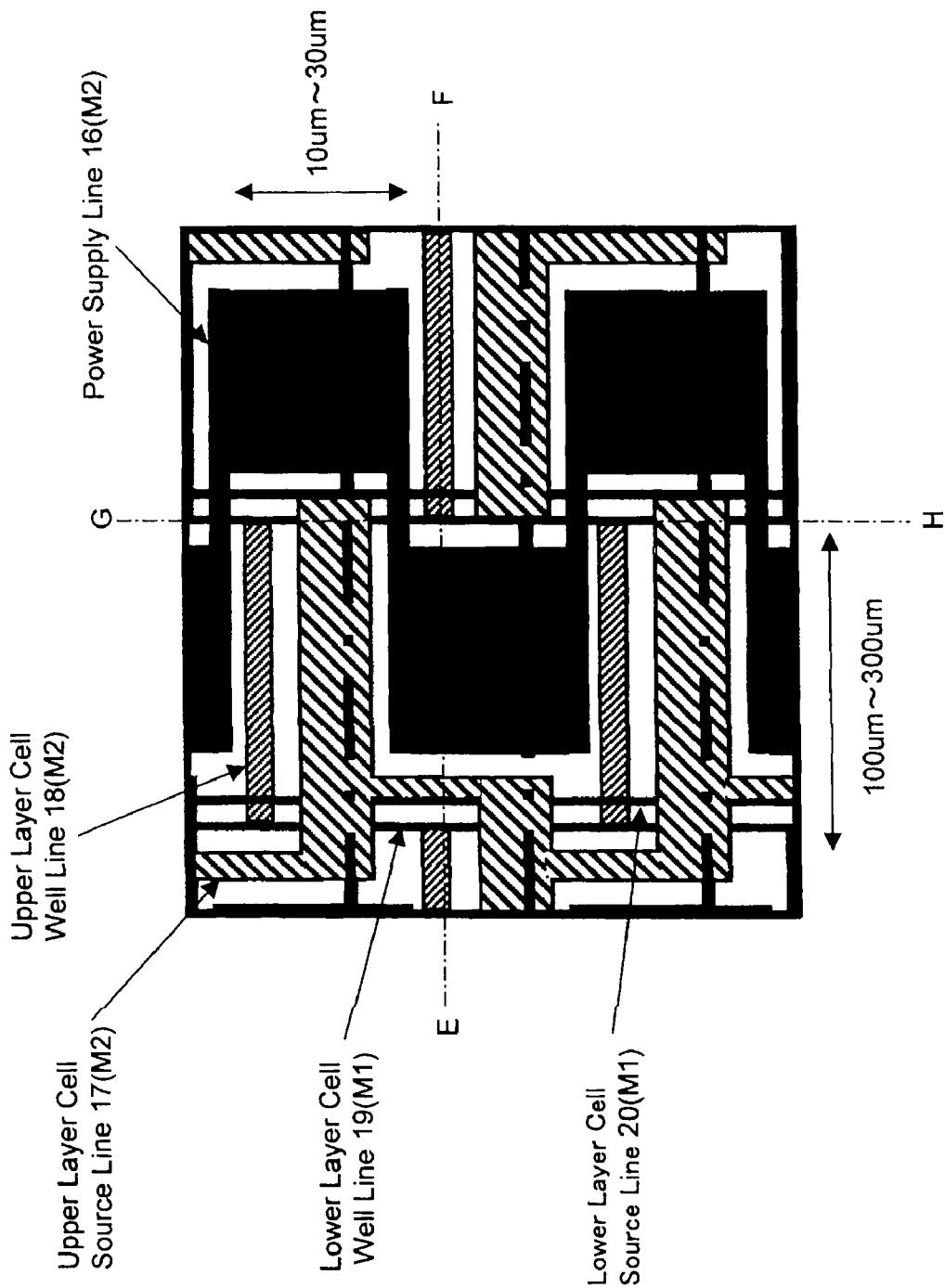
FIG. 5 is an expanded view diagram of the attention area in FIG. 1 related to the first embodiment of the present invention.
Figure 6:
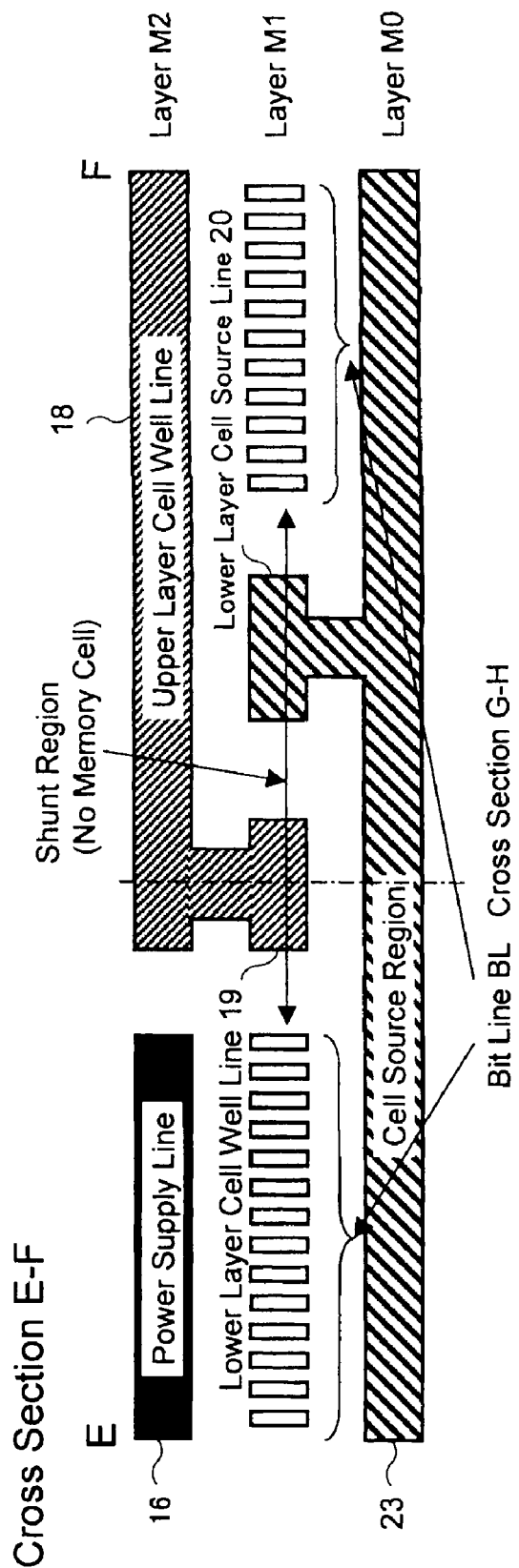
FIG. 6 is a diagram which shows a cross section structure of the line E-F in FIG. 5 related to the first embodiment of the present invention.
Figure 7:
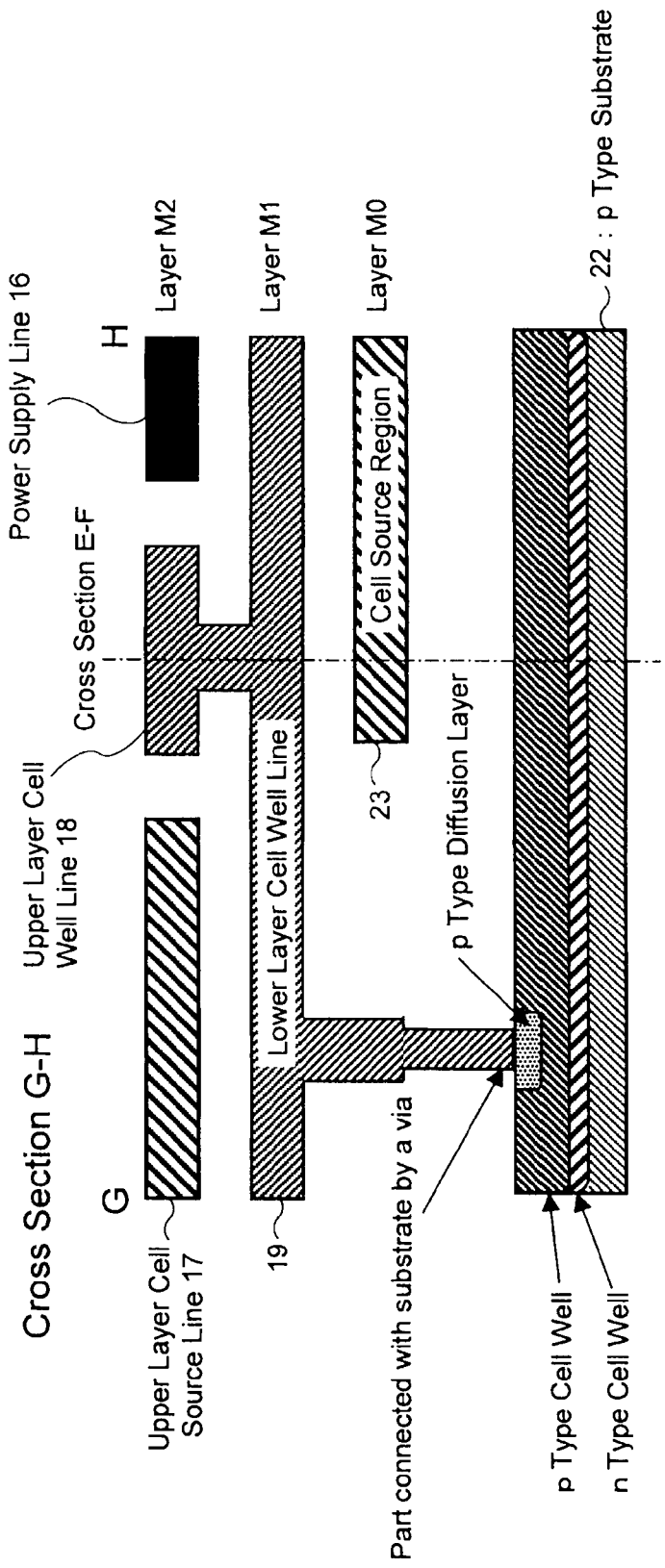
FIG. 7 is a diagram which shows a cross section structure of the line G-H in FIG. 5 related to the first embodiment of the present invention.

Next, the cross section structure of the attention area 10A shown by a dotted line within the cell array region 10 in FIG. 1 will be explained while referring to FIG. 2 to FIG. 7. FIG. 2 is an expanded planar view of the attention area 10A. FIG. 3 is diagram which shows a cross section structure of the line A-B in FIG. 2. FIG. 4 is a diagram which shows a cross section structure of the line C-D in FIG. 2. FIG. 5 is an expanded view of the attention area 10A. FIG. 6 is a diagram which shows a cross section structure of the line E-F in FIG. 5. FIG. 7 is a diagram which shows a cross section structure of the line G-H in FIG. 6. Furthermore, in FIG. 2 to FIG. 7, the same structural elements as those in FIG. 1 have the same symbols.

In order to show the approximate dimensions of the attention area 10A in FIG. 2 the exterior of the attention area 10A is shown as [100 μm-300 μm] and [10 μm-30 μm]. A cross section structure of one part of the line A-B shown by a dashed dot line is shown in FIG. 3.

In FIG. 3, a cell source region 23 is formed on a layer M0 which is the lowermost layer. The cell source region 23 of this layer M0 is a layer which can not be seen in the planar view diagrams FIG. 1 and FIG. 2. A bit line BL, lower layer cell well line 19 and lower layer cell source line 20 are formed on a layer M1 above the layer M0. A power supply line 16 and an upper layer cell source line 17 are formed in a layer M2 above the layer M1. The lower layer cell well line 19 and the lower layer cell source line 20 are arranged in a formation direction of a bit line BL of the layer M0 within the cell array region 10, and are formed in the shunt region in which not bit lines BL are formed. The upper layer cell source line 17, the lower layer cell source line 20 and cell source region 23 are mutually connected by a Via. In addition, in FIG. 3, the position of the cross section C-D explained below is also shown.

Next, the cross section structure of one part of the line C-D shown by a dashed dot line in FIG. 2 is shown in FIG. 4. In FIG. 4, a substrate 22 comprised from a P well etc is arranged on a layer lower than the layer M0. A plurality of floating gates FG of a cell transistor which becomes a memory cell and a plurality of word lines WL for selecting a cell transistor are formed between the substrate 22 and the layer M0. In addition, a plurality of source side selection gates SSG for selecting each memory string and a plurality of bit line side selection gates BSG are formed on the layer in which these floating gates FG and word lines WL are formed. In addition, in FIG. 4, the position of the cross section A-B is also shown.

In addition, in FIG. 4, a cell source region 23, a bit line BL and an upper layer cell source line 17 are each formed on the layers M0, M1, M2 respectively the same as the cross section structure shown in FIG. 3. Furthermore, in FIG. 4, in the case where the substrate 22 is a p type substrate 22, as shown in the diagram, an n type cell well and p type cell well are formed in the p type substrate 22. An n type diffusion layer is formed in a region which connects a region corresponding to a cell array region within the p type cell well, the cell source region 23 and p type cell well. The cell source region 23 and a bit line BL are each connected respectively to a p type well through the n type diffusion layer by a Via.

Next, the cross section structure of one part of the line E-F shown by a dashed dot line within the attention area 10A shown in FIG. 5 is shown in FIG. 6. Furthermore, an expanded view of the attention area 10A shown in FIG. 5 is the same as the expanded view shown in FIG. 2 and only the positions of the dashed dotted lines E-F, G-H are different.

A lower layer cell well line 19 formed on the layer M1 and an upper layer cell well line 18 formed on the layer M2 are connected by a Via as shown in FIG. 6. The lower layer cell well line 19 and a lower layer cell source line 20 are arranged in a formation direction of a bit line BL on the layer M1 within the cell array region 10 and formed in the shunt region in which not bit line BL are formed. In FIG. 5, because the structure of the layers M0 and M1 is almost the same as the cross section structure shown in FIG. 3 and explanation will be omitted here. In addition, in FIG. 5, the position of the cross section G-H explained below is also shown.

Next, the cross section structure of one part of the line G-H shown by a dashed dot line in FIG. 5 is shown in FIG. 7. A lower layer cell well line 19 formed on the layer M1 is connected to the substrate 22 by a Via as is shown in FIG. 7. In FIG. 7, a cell source region 23 is formed on the layer M0, and a power supply line 16, an upper layer cell source line 17 and an upper layer cell well line 18 are formed on the layer M2. In addition, in FIG. 7, in the case where the substrate 22 is a p type substrate 22, as shown in the diagram, an n type cell well and p type cell well are formed in the p type substrate 22. A p type diffusion layer is formed in a region which connects a lower layer cell source line 19 within the p type cell well and a p type cell well. The lower layer cell source line 19 is connected to a p type well through a p type diffusion layer by a Via.

As stated above, in the NAND type flash memory 1 related to the first embodiment, a lower layer cell well line 19 and lower layer cell source line 20 are formed on the layer M1 on which a bit line BL is formed, and an upper layer cell source line 17 and upper layer cell well line 18 are formed an the layer M2 above the layer M1. Then, the lower layer cell well 19 and the lower layer cell source line 20 are mutually connected with the upper layer cell source line 17 and the upper layer cell well line 19 by a Via. In addition, the lower layer cell well line 19 and the lower layer cell source line 20 are formed in the shunt region in which no memory cells of the layer M1 are formed.

Therefore, by forming an upper layer cell source line (first wire) 17 and an upper layer cell well line (second wire) 18 on the layer M2 within the cell array region 10, it is possible to pass the upper layer cell source line 17 and lower layer cell well line 18 in a bit line direction. In addition, it is also possible to connect the ground drivers 12A, 12B, 13A and 13B arranged in a word line direction with an upper layer cell source line 17 and upper layer cell well line 18. That is, it is no longer necessary to pull the upper layer cell source line 17 and upper layer cell well line 18 to the outside of the cell array region 10 and it becomes possible to reduce each wire resistance of the upper layer cell source line 17 and upper layer cell well line 18.

Furthermore, in the NAND type flash memory 1 related to the first embodiment, a power supply line 16 is formed without division on the layer M2 within the cell array region 10. As a result, the power supply line 16 can also be passed in a bit line direction.

Second Embodiment

In the second embodiment, an example in which the structure of the power supply line 16 used in the first embodiment explained above is changed will be explained.

FIG. 8 is a planar view diagram which shows the structure of a NAND type flash memory 30 related to the second embodiment of the present invention. In FIG. 8, the same structural elements as in the NAND type flash memory 1 shown in FIG. 1 have the same symbols and thus an explanation of this structure is omitted here. In addition, the structure within the cell array 10 in FIG. 8 is almost the same as the structure within the cell array 10 shown in FIG. 1. Therefore, the cross section structure shown in FIG. 2 to FIG. 7 is the same and an explanation is omitted here.

In the NAND type flash memory 30 shown in FIG. 8, power supply lines 16, 31 are formed without division on the layer M2 within the cell array region 10. Furthermore, at the bottom of FIG. 8, power supply pads 21, 32 for connecting with a power supply etc arranged outside of the memory chip are arranged. The power supply pad 21 is connected with the plurality of power supply lines 16. The power supply pad 32 is connected with the plurality of power supply lines 31.

Both ends of each power supply pad 16, 31 are respectively connected to peripheral circuits 15A, 15B, and the power supply lines 16, 31 are for supplying two types of divided power supply voltage (Vdd, Vss etc) to each memory cell.

As stated above, in the NAND type flash memory 30 related to the second embodiment, the power supply lines are divided into power supply lines 16 and power supply lines 31 which pass in a bit line direction in the layer M2. As a result, it becomes possible to pass a wire which supplies two types of different power supply voltage within the cell array region 10.

Third Embodiment

In the third embodiment of the present invention, an example in which the structure of the row decoders 11A, 11B and the ground drivers 12A, 12B, 13A, 13B used in the first embodiment described above, is changed will be explained.

FIG. 9 is a planar view diagram which shows the structure of a NAND type flash memory 40 related to the third embodiment of the present invention. In FIG. 9, the same structural elements as in the NAND type flash memory 1 shown in FIG. 1 have the same symbols and thus an explanation of this structure is omitted here. In addition, the structure within the cell array 10 in FIG. 9 is almost the same as the structure within the cell array 10 shown in FIG. 1. Therefore, the cross section structure shown in FIG. 2 to FIG. 7 is the same and an explanation is omitted here.

In the NAND type flash memory 40 shown in FIG. 9, a row decoder 41, a cell well ground driver 42 and a cell source ground driver 43 are grouped and arranged on only the right side in the diagram outside of the cell array region 10. In this case, the upper layer cell source line 17 and upper layer cell well line 18 are connected to the cell source ground driver 43 and cell well ground driver 42 respectively.

As stated above, the NAND type flash memory 40 related to the third embodiment has a structure in which a cell well ground driver 42 and a cell source ground driver 43 are arranged on only one side outside of the cell array region 10 and the upper layer cell source line 17 and the upper layer cell well line 18 formed on the layer M2 within the cell array region 10 are connected.

Therefore, it is no longer necessary to pull the upper layer cell source line 17 and upper layer cell well line 18 to the outside of the cell array region 10 and it becomes possible to reduce each wire resistance of the upper layer cell source line 17 and upper layer cell well line 18.

Furthermore, in the first to third embodiments described above, an example was explained using a NAND type flash memory arranged with a floating gate, however, the present invention is not limited to this. For example, the present invention can also be applied to a MONOS (Metal Oxide Nitride Oxide Silicon) type flash memory which does not have a floating gate.

What is claimed is:

1. A nonvolatile semiconductor memory device comprising:
   a cell array including a memory string, said memory string including a plurality of memory cells connected in series;
   a bit line connected to said memory string;
   a first wire connected to a cell source of said plurality of memory cells;
   a second wire connected to a cell well line of a memory cell of said plurality of memory cells;
   a third wire which supplies a power supply voltage to a circuit arranged outside of a region of said cell array;
   a fourth wire formed in a first direction which is parallel to said bit line within said cell array region;
   a fifth wire formed in said first direction within said cell array region; and
   said first wire, said second wire and said third wire being formed in a layer above a layer in which said bit line within said cell array region is formed, said fourth wire and said fifth wire being formed in said layer in which said bit line within said cell array region is formed, and said first wire and said fourth wire being connected and said second wire and said fifth wire being connected.

2. The nonvolatile semiconductor memory device according to claim 1, further comprising:
   a row decoder arranged outside of said cell array region; and
   a cell source ground driver arranged in an arranging region of said row decoder, said cell source ground driver grounding said cell source line, and said first wire connecting said cell source line and said cell source ground driver.

3. The nonvolatile semiconductor memory device according to claim 1, further comprising:
   a row decoder arranged outside of said cell array region; and
   a cell well ground driver arranged in an arranging region of said row decoder, said cell well ground driver grounding said cell well, and said second wire connecting said cell well line and said cell well ground driver.

4. The nonvolatile semiconductor memory device according to claim 2, wherein said third wire is formed in said first direction within said cell array region without dividing.

5. The nonvolatile semiconductor memory device according to claim 2, wherein said fourth wire and said fifth wire are arranged in a region in which said plurality of memory cells within said cell array region are not formed.

6. The nonvolatile semiconductor memory device according to claim 1, further comprising:
   a row decoder arranged outside of said cell array region; and
   a cell source ground driver arranged on both sides in said first direction outside of said cell array region, a cell source wire network including said plurality of said first wires formed in a second direction which is perpendicular to said first direction within said cell array region, and said plurality of said fourth wires formed in said first direction within said cell array region, said plurality of first wires connecting to said plurality of said fourth wires and said cell source ground driver.

7. The nonvolatile semiconductor memory device according to claim 1, further comprising:
   a row decoder arranged outside of said cell array region; and
   a cell well ground driver arranged on both sides in said first direction outside of said cell array region, a cell well wire network including said plurality of said second wires formed in a second direction which is perpendicular to said first direction within said cell array region, and said plurality of said fifth wires formed in said first direction within said cell array region, said plurality of second wires connecting said plurality of said fifth wires and said cell well ground driver.

8. The nonvolatile semiconductor memory device according to claim 2, further comprising:
   a sense amplifier circuit arranged on both sides in a second direction which is perpendicular to said first direction outside of said cell array region, said plurality of said third wires being formed in said first direction and arranged in said second direction within said cell array region, said plurality of third wires mutually connecting said sense amplifier circuit.

9. The nonvolatile semiconductor memory device according to claim 2, further comprising:
   a peripheral circuit arranged on both sides in a second direction which is perpendicular to said first direction outside of said cell array region, said plurality of said third wires being formed in said first direction within said cell array region and arranged in said second direction within said cell array region, said plurality of third wires mutually connecting said peripheral circuit.

10. The nonvolatile semiconductor memory device according to claim 8, further comprising:
    a power supply pad placed outside of said cell array region, said plurality of third wires being connected to said power supply pad and connected to an external power supply via said power supply pad.

11. The nonvolatile semiconductor memory device according to claim 2, wherein said first wire and said fourth wire are mutually connected by a first via, said fourth wire being connected to a diffusion layer of a substrate by a second via.

12. The nonvolatile semiconductor memory device according to claim 2, wherein said second wire and said fifth wire are mutually connected by a third via, said fifth wire being connected to a diffusion layer of a substrate by a fourth via.

13. The nonvolatile semiconductor memory device according to claim 2, wherein a cell source region of said memory cell is formed in a lower layer than a layer in which said bit line is formed, said bit line and said cell source region being connected to a diffusion layer of a substrate by a via.

14. The nonvolatile semiconductor memory device according to claim 2, wherein a floating gate of said memory cell, a word line connected to said memory string and a select gate which selects said memory string are formed in a lower layer than a layer in which said cell source region is formed.

15. The nonvolatile semiconductor memory device according to claim 2, further comprising:
   a plurality of power supply pads outside of said cell array region,
   said plurality of said third wires being formed in said first direction and arranged in a second direction which is perpendicular to said first direction within said cell array region, said plurality of third wires being connected to said power supply pad, and also connected to an external power supply via said power supply pad.

16. The nonvolatile semiconductor memory device according to claim 1, further comprising:
   a cell source ground driver arranged on one side in said first direction within outside said cell array region, a cell source wire network including said plurality of said first wires formed in a second direction which is perpendicular to said first direction within said cell array region, and said plurality of said fourth wires formed in said first direction within said cell array region; and
   said plurality of first wires connecting said plurality of said fourth wires and said cell source ground driver.

17. The nonvolatile semiconductor memory device according to claim 1, further comprising:
   a cell well ground driver arranged on one side in said first direction outside of said cell array region, a cell well wire network being including said plurality of said second wires formed in a second direction which is perpendicular to said first direction within said cell array region, and plurality of said fifth wires formed in said first direction within said cell array region, said plurality of second wires connecting said plurality of fourth wires and said cell well ground driver.

* * * * *